United States Patent [19]

Kumakura et al.

[11] Patent Number: 5,066,691
[45] Date of Patent: Nov. 19, 1991

[54] ADHESIVE COMPOSITION FOR METAL-CLAD LAMINATES

[75] Inventors: Toshihisa Kumakura; Ken Nanaumi; Ryoichi Ikezawa; Hideki Eriguchi, all of Shimodate, Japan

[73] Assignee: Hitachi Chemical Co., Ltd., Tokyo, Japan

[21] Appl. No.: 442,637

[22] Filed: Nov. 29, 1989

[30] Foreign Application Priority Data

Dec. 5, 1988 [JP] Japan ................... 63-307617

[51] Int. Cl.$^5$ .......................... C08K 3/22; C08L 29/04
[52] U.S. Cl. ........................... 523/438; 523/457; 524/437; 525/57; 525/58; 525/59
[58] Field of Search .................. 525/57, 59, 58; 523/438

[56] References Cited

U.S. PATENT DOCUMENTS 3,932,689  1/1976  Watanabe et al. ............. 525/58

FOREIGN PATENT DOCUMENTS

| 58-204072 | 11/1983 | Japan | 525/58 |
| 59-78282  | 5/1984  | Japan | 525/57 |
| 61-43550  | 3/1986  | Japan | 525/58 |
| 61-143480 | 7/1986  | Japan | 525/57 |
| 61-213247 | 9/1986  | Japan | 525/57 |
| 62-30173  | 2/1987  | Japan | 525/58 |
| 62-54780  | 3/1987  | Japan | 525/57 |

OTHER PUBLICATIONS

Lee, Henry *Handbook of Epoxy Resins*, 1967, 3-14,15 and 11-3.

*Primary Examiner*—Melvyn I. Marquis
*Assistant Examiner*—David C. Rowley
*Attorney, Agent, or Firm*—Antonelli, Terry, Stout & Kraus

[57] ABSTRACT

An adhesive composition for metal-clad laminates which comprises:
(a) 100 parts by weight of a polyvinylbutyral having an average polymerization degree of from 500 to 3,000 and a degree of butyralization of at least 60 mol %,
(b) from 10 to 200 parts by weight of an epoxidized polybutadiene per 100 parts by weight of the polyvinylbutyral, the epoxidized polybutadiene having a number average molecular weight of from 1,000 to 10,000 and an epoxy equivalent weight of from 200 to 2,000, and
(c) from 1 to 10 parts by weight of a hardener for the epoxidized polybutadiene per 100 parts by weight of the epoxidized polybutadiene.

4 Claims, No Drawings

ADHESIVE COMPOSITION FOR METAL-CLAD LAMINATES

BACKGROUND OF THE INVENTION (a) Field of the Invention

The present invention relates to an adhesive composition for metal-clad laminates, which can be used for bonding a metal foil to a laminate.

(b) Description of the Related Art

With the advances of the minimization and functional improvement of electronic equipments for domestic use, the printed wiring boards to be used for such electronic equipments have become denser and minuter in their wiring patterns. Following this there has been an increasing demand for metal-clad laminates which can bring about printed wiring boards capable of enabling high density packaging. Therefore, the requirements for the solder resistance and peel strength have become more strict. Additionally, for those on which a high voltage may be applied, for example, those for televisions, tracking resistance has become essential in order to insure security. "Tracking" is a phenomenon that the surface of an insulator is carbonized in the regions on which potential differences generate, thereby forming conductive paths.

In the past, adhesives prepared by blending a polyvinylbutyral with a phenolic resin have been used for bonding a metal foil to a laminate because they have excellent soldering heat resistance and metal peel strength.

Though such adhesives prepared by blending a polyvinylbutyral with a phenolic resin excel in soldering heat resistance and metal peel strength, they have poor tracking resistance because phenolic resins contained therein are easily carbonized causing continuity.

In Japanese Patent Application Kokai Koho (Laid-open) No. 02-110082, etc. proposed was the use of epoxy resins or melamine resins, which are hardly carbonized, as the substituent component for phenolic resins. Although an increase in tracking resistance was attained in these methods, it was difficult to maintain the solder resistance at the required level.

Further, a high peel strength of circuits, i.e. a high peel strength, at high temperatures has come to be required because circuits generate heat when a high voltage is applied thereon. However, no adhesive has ever succeeded in satisfying both the requirements for the tracking resistance and the peel strength at high temperature.

SUMMARY OF THE INVENTION

The present invention has been achieved under the above-described circumstances, and an object of the present invention is to provide an adhesive composition for metal-clad laminates which has an excellent tracking resistance but is not deteriorated in solder resistance.

Another object of the present invention is to provide an adhesive composition for metal-clad laminates which has an excellent peel strength even at high temperatures.

According to the present invention, there is provided an adhesive composition for metal-clad laminates which comprises:

(a) 100 parts by weight of a polyvinylbutyral having an average polymerization degree of from 500 to 3,000 and a degree of butyralization of at least 60 mol %.

(b) from 10 to 200 parts by weight of an epoxidized polybutadiene per 100 parts by weight of the polyvinylbutyral, the epoxidized polybutadiene having a number average molecular weight of from 1,000 to 10,000 and an epoxy equivalent weight of from 200 to 2,000, and (c) from 1 to 10 parts by weight of a hardener for the epoxidized polybutadiene per 100 parts by weight of the epoxidized polybutadiene.

The adhesive composition for metal-clad laminates of the present invention can increase the tracking resistance of metal-clad laminates without decreasing the soldering heat resistance.

When (d) from 10 to 200 parts by weight of aluminum hydroxide having an average particle size of from 0.1 to 10 $\mu m$ is added to the above-described adhesive composition of the present invention as a filler, the peel strength at high temperatures is further improved.

DESCRIPTION OF THE PREFERRED EMBODIMENTS

There is no particular restriction in the polyvinylbutyral to be used in the present invention as far as it has the above-described specific average polymerization degree and degree of butyralization. If the average polymerization degree is less than 500, the heat resistance of the adhesive composition will be insufficient, and if it exceeds 3,000, the viscosity of the adhesive composition will become too high, and it will become difficult to apply the adhesive composition to metal foils. The preferred average polymerization degree ranges from 1,000 to 2,500. The degree of butyralization is not particularly limited as far as it is in the above described range. If it is less than 60 mol %, the softness of the adhesive will be insufficient resulting in a decrease of the adhesion strength.

Some typical examples of the polyvinylbutyral which may be used in the present invention include POLYVINYLBUTYRAL BX-1 (average polymerization degree: 1,700 degree of butyralization: 65 mol %). POLYVINYLBUTYRAL BX-2 (average polymerization degree: 1,700, degree of butyralization: 65 mol %), and POLYVINYLBUTYRAL BX-55 (average polymerization degree: 1,700, degree of butyralization: 70 mol %) (produced by Sekisui Chemical Co., Ltd.; Trade name). and DENKA BUTYRAL 4000-2 (average polymerization degree: 1,000, degree of butyralization: 75 mol %). DENKA BUTYRAL 5,000-A (average polymerization degree: 2,000. degree of butyralization: 80 mol %). and DENKA BUTYRAL 6,000-C (average polymerization degree: 2,400, degree of butyralization: 80 mol %) (produced by Denki Kagaku Kogyo K.K.; Trade name). These polyvinylbutyrals may be used individually or as a mixture of two or more of them.

There is no particular restriction in the epoxidized polybutadiene to be used in the present invention as far as it has the above-described ranges of epoxy equivalent weight and number average molecular weight. If the number average molecular weight is less than 1.000, the solder resistance of the adhesive composition will be insufficient, and if it exceeds 10.000, the compatibility of the resin components will become poor, and it will become impossible to evenly apply the adhesive composition on metal foils. If the epoxy equivalent weight is less than 200, the crosslinking density of the cured resin will become too high, and the softness of the adhesive will become insufficient, resulting in a poor peel strength. On the other hand if it exceeds 2,000, the crosslinking density of the cured resin will become too small resulting in an insufficient softness of the resin and a poor peel strength as a consequence.

Some typical examples of the epoxidized polybutadiene which may be used in the present invention include R-45EPI (number average molecular weight: 3,200, epoxy equivalent weight: 200) and R-45EPT (number average molecular weight: 3,200, epoxy equivalent weight: 1,350) (produced by Idemitsu Petrochemical Co., Ltd.: Trade name) and BF-1000 (number average molecular weight: 1,300, epoxy equivalent weight: 200) (produced by Nippon Soda Co., Ltd.; Trade name).

The adhesive composition for metal-clad laminates of the present invention contains 10 to 200 parts by weight, preferably 10 to 100 parts by weight of at least one kind of the above-described epoxidized polybutadiene per 100 parts by weight of the above-described polyvinylbutyral. If the amount of the epoxidized polybutadiene used is less than 10 parts by weight, the adhesive composition will not cure sufficiently resulting in a poor solder resistance, and on the other hand, if it exceeds 200 parts by weight, the compatibility of the resin components will become poor and the cured resin will consequently become so brittle as to be unable to satisfy the required solder resistance.

In addition to the above-described two resin components, the adhesive composition of the present invention contains a hardener for the epoxidized polybutadiene. The particularly effective examples of the hardener are complexes of $BF_3$ (boron trifluoride). Some typical examples of the complexes of $BF_3$ include $BF_3$-monoethylamine complex $BF_3$-piperidine complex. $BF_3$-triethanolamine complex. $BF_3$-diethyl ether complex, and $BF_3$-methanol complex. The adhesive composition of the present invention contains one or more kinds of these hardeners. The amount of the hardener to be mixed is 1 to 10 parts by weight per 100 parts by weight of the epoxidized polybutadiene.

Under certain circumstances, the adhesive composition of the present invention may further contain other resins, for example, melamine resins such as alkylated melamine resins and alkyl etherized melamine resins; and benzoguanamine resins. The kinds and amounts of these resins to be added are not particularly limited. By addition of one or more kinds of these melamine resins or benzoguanamine resins to the adhesive composition of the present invention, a larger increase in the soldering heat resistance can be expected though the tracking resistance may be decreased a little.

It was found that the peel strength at high temperatures can be improved largely by further adding 10 to 200 parts by weight of aluminum hydroxide having an average particle size of from 0.1 to 10 μm as a filler per 100 parts by weight of the polyvinylbutyral.

The lowest limit of the particle size of aluminum hydroxide was defined for the reason that the aluminum hydroxide having an average particle size of less than 0.1 μm is hardly available. On the other hand, the aluminum having an average particle size of more than 10 μm is inferior in sedimentation property and decreases the solder resistance of laminates. The preferred average particle size ranges from 0.3 to 3 μm. If the amount of the aluminum hydroxide is less than 10 parts by weight, the effect in improving the peel strength at high temperatures will be insufficient, and if it exceeds 200 parts by weight, the peel strength at room temperature and the solder resistance will be deteriorated.

The adhesive composition of the present invention is prepared by adding an organic solvent to the abovedescribed components as required and mixing them.

The solvent which ma be used in the present invention is not particularly limited as far as it dissolves the above-described components, and the typical examples include methanol, ethanol, isopropyl alcohol, n-butanol, acetone, toluene, methyl ethyl ketone, cyclohexanone, dimethylformamide, dimethylsulfoxide, N-methylpyrrolidone, hexamethylphosphoramide, methyl cellosolve, ethyl cellosolve, and cellosolve acetate.

It is also possible to add other additives, such as other fillers and coupling agents as required.

The adhesive composition obtained by mixing the components as described above is applied to the surface of a metal foil, to prepare an adhesive-coated metal foil. The metal foil which may be used is not particularly limited, and the typical examples include copper foil and aluminum foil. The application method is not particularly limited, and for example, kiss-roll coating, roll coating, and spin coating may be employed.

A metal-clad laminate may be prepared by putting several sheets of prepregs of phenolic resin-impregnated paper or glass base materials in layers on the above-described adhesive-coated metal foil, followed by thermo-compression molding them. The conditions of thermo-compression molding is not particularly limited, but it is desirable to carry out thermo-compression molding at a pressure of 50 to 200 kgf/cm$^2$, at a temperature of 150 to 180° C., for 60 to 120 minutes.

The present invention will be described in more detail with reference to the following examples. These examples, however, are intended to illustrate the invention and are not to be construed to limit the scope of the invention.

EXAMPLES 1 TO 5 AND COMPARATIVE EXAMPLES 1 AND 2

In each Example, an adhesive composition for laminates was prepared by dissolving uniformly the components shown in Table 1 in a methanol-methyl ethyl ketone solvent mixture in the mixing ratio as shown in Table 1. The obtained adhesive was applied on a surface of a copper foil of 35 μm thick by using a roll coater, followed by drying and curing, to obtain an adhesive-coated copper foil having an adhesive layer of 40 μm thick. On the adhesive surface of the obtained copper foil putted in layers were 8 sheets of prepregs of phenolic resin-impregnated material. The obtained, laminated article was sandwiched between two stainless steel panel boards and was then thermo-compression molded at 160° C. and at 100 kgf/cm$^2$ for 60 minutes, to obtain a copper-clad laminate.

The properties of the obtained copper-clad laminates are shown in Table 1.

TABLE 1

| | Example 1 | Example 2 | Example 3 | Example 4 |
|---|---|---|---|---|
| Adhesive composition (wt. parts) | | | | |
| Polyvinyl- | DENKA BUTYRAL | DENKA BUTYRAL | DENKA BUTYRAL | DENKA BUTYRAL |

TABLE 1-continued

|  | | | | |
|---|---|---|---|---|
| butyral | 4000 (100) | 4000 (100) | 4000 (100) | 4000 (100) |
| Epoxidized poly-butadiene | R-45EPI (50) | R-45EPI (150) | BF-1000 (50) | R-45EPI (100) |
| Phenolic resin | — | — | — | — |
| Hardener | BF$_3$-monoethylamine complex (1.5) | BF$_3$-monoethylamine complex (4.5) | BF$_3$-piperidine complex (1.5) | BF$_3$-monoethylamine complex (3.0) |
| Filler | — | — | — | Aluminum hydroxide (100) |
| Properties of copper-clad laminate | | | | |
| Tracking resistance (number of drops) | 90< | 90< | 90< | 95< |
| Solder resistance (sec) | 33 | 31 | 32 | 35 |
| Copper foil peel 25° C. strength (kg/cm) | 2.2 | 2.1 | 2.4 | 2.0 |
| 150° C. | 0.3 | 0.3 | 0.3 | 0.6 |

|  | Example 5 | Comparative example 1 | Comparative example 2 |
|---|---|---|---|
| Adhesive composition (wt. parts) | | | |
| Polyvinylbutyral | DENKA BUTYRAL 4000 (100) | DENKA BUTYRAL 4000 (100) | DENKA BUTYRAL 4000 (100) |
| Epoxidized poly-butadiene | BF-1000 (50) | EPIKOTE 815 (50) | — |
| Phenolic resin | — | — | Resol-type phenolic resin (50) |
| Hardener | BF$_3$-piperidine complex (1.5) | BF$_3$-monoethylamine complex (1.5) | — |
| Filler | Aluminum hydroxide (150) | — | — |
| Properties of copper-clad laminate | | | |
| Tracking resistance (number of drops) | 95< | 60 | 10 |
| Solder resistance (sec) | 33 | 9 | 33 |
| Copper foil peel 25° C. strength (kg/cm) | 2.0 | 2.0 | 1.9 |
| 150° C. | 0.7 | 0.4 | 0.7 |

EPIKOTE 815: a Bisphenol A-type epoxy resin (produced by Yuka Epoxy Co., Ltd; Trade name)
Aluminum Hydroxide: average particle size: 8 μm
Measurements of solder resistance and copper metal peel strength were conducted in accordance with JIS C 6481.
Measurement of tracking resistance was conducted according to IEC method at a voltage applied of 600 V.

Apparently, in comparison with the Comparative Examples, an improvement in the tracking resistance is observed in every example, and no decrease in the soldering heat resistance nor in the copper foil peel strength is observed.

Further, an improvement in the copper foil peel strength at high temperature is observed in Examples 4 and 5 where aluminum hydroxide was added as a filler.

What is claimed is:

1. An adhesive composition for metal-clad laminates which consists essentially of:
   (a) 100 parts by weight of a polyvinylbutyral having an average polymerization degree of from 500 to 3,000 and a degree of butyralization of at least 60 mol %,
   (b) from 10 to 200 parts by weight of the polybutadiene per 100 parts by weight of the polyvinylbutyral, the epoxidized polybutadiene having a number average molecular weight of from 1,000 to 10,000 and an epoxy equivalent weight of from 200 to 2,000, and
   (c) from 1 to 10 parts by weight of a hardener for the epoxidized polybutadiene per 100 parts by weight of the epoxidized polybutadiene.

2. An adhesive composition for metal-clad laminates which consists essentially of:
   (a) 100 parts by weight of a polyvinylbutyral having an average polymerization degree of from 500 to 3,000 and a degree of butyralization of at least 60 mol %,
   (b) from 10 to 200 parts by weight of an epoxidized polybutadiene per 100 parts by weight of the polyvinylbutyral, the epoxidized polybutadiene having a number average molecular weight of from 1,000 to 10,000 and an epoxy equivalent weight of from 200 to 2,000, (c) from 1 to 10 parts by weight of a hardener for the epoxidized polybutadiene per 100 parts by weight of the epoxidized polybutadiene, and (d) from 10 to 200 parts by weight of aluminum hydroxide having an average particle size of from 0.1 to 10 μm as a filler.

3. The adhesive composition for metal-clad laminates as claimed in claim 1 or claim 2, wherein the hardener is a boron trifluoride complex.

4. The adhesive composition for metal-clad laminates as claimed in claim 3, wherein the boron trifluoride complex s a boron trifluoride complex selected from the group consisting of boron trifluoride-monoethylamine complex and boron trifluoride-piperidine complex.

* * * * *